US011355565B2

(12) United States Patent
Beak et al.

(10) Patent No.: US 11,355,565 B2
(45) Date of Patent: Jun. 7, 2022

(54) DISPLAY PANEL

(71) Applicant: LG Display Co., Ltd., Seoul (KR)

(72) Inventors: JungSun Beak, Paju-si (KR); Seongjoo Lee, Paju-si (KR); Sunmi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/548,680

(22) Filed: Aug. 22, 2019

(65) Prior Publication Data
US 2020/0194509 A1 Jun. 18, 2020

(30) Foreign Application Priority Data
Dec. 17, 2018 (KR) ........................ 10-2018-0163602

(51) Int. Cl.
*H01L 27/32* (2006.01)
*H01L 51/52* (2006.01)

(52) U.S. Cl.
CPC ........ *H01L 27/326* (2013.01); *H01L 27/3246* (2013.01); *H01L 51/5209* (2013.01); *H01L 51/5225* (2013.01); *H01L 2251/558* (2013.01)

(58) Field of Classification Search
None
See application file for complete search history.

(56) References Cited

U.S. PATENT DOCUMENTS

| 7,227,306 | B2 | 6/2007 | Park et al. |
| 8,487,310 | B2 | 7/2013 | Kang et al. |
| 8,809,863 | B2 | 8/2014 | Kim et al. |
| 9,029,838 | B2 | 5/2015 | Lim et al. |
| 9,076,739 | B2 | 7/2015 | Choi et al. |
| 9,136,506 | B2 | 9/2015 | Kim et al. |
| 9,142,793 | B2 | 9/2015 | Choi et al. |
| 9,478,742 | B2 | 10/2016 | Takagi et al. |
| 9,515,290 | B2 | 12/2016 | Lim et al. |
| 9,536,931 | B2 | 1/2017 | Kim et al. |
| 9,601,524 | B2 * | 3/2017 | Tae ................ H01L 27/1248 |
| 9,711,756 | B2 * | 7/2017 | Lee ................ H01L 51/5256 |
| 9,978,819 | B2 * | 5/2018 | Jang ................ H01L 27/326 |
| 9,978,828 | B2 * | 5/2018 | Kim ................ H01L 51/5228 |
| 10,002,912 | B2 * | 6/2018 | Song ................ H01L 27/3213 |
| 10,079,365 | B2 * | 9/2018 | Kim ................ H01L 27/3248 |
| 10,096,659 | B2 * | 10/2018 | Kim ................ H01L 27/322 |
| 10,181,498 | B2 * | 1/2019 | Song ................ H01L 27/3213 |
| 10,181,574 | B2 | 1/2019 | Koo et al. |

(Continued)

FOREIGN PATENT DOCUMENTS

| JP | 2005-063787 A | 3/2005 |
| JP | 2011-159419 A | 8/2011 |

(Continued)

OTHER PUBLICATIONS

Extended European Search Report, European Patent Application No. 19216945.6, dated May 26, 2020, 8 pages.

(Continued)

*Primary Examiner* — Telly D Green
(74) *Attorney, Agent, or Firm* — Fenwick & West LLP

(57) ABSTRACT

The present disclosure relates to a display panel. More specifically, the display panel is configured to surround an opening area, includes a reflective electrode including an inclined surface, and therefore provides increased luminous efficiency.

15 Claims, 10 Drawing Sheets

(56) References Cited

U.S. PATENT DOCUMENTS

| | | | |
|---|---|---|---|
| 10,319,796 B2* | 6/2019 | Jang | H01L 27/326 |
| 10,319,948 B2* | 6/2019 | Kim | H01L 51/5275 |
| 10,355,234 B2 | 7/2019 | Choi et al. | |
| 10,373,978 B2 | 8/2019 | Lee et al. | |
| 10,374,197 B2* | 8/2019 | Kim | H01L 51/5271 |
| 10,475,866 B2 | 11/2019 | Choi et al. | |
| 10,608,063 B2* | 3/2020 | Jang | H01L 27/3272 |
| 10,635,209 B2* | 4/2020 | Seong | H01L 27/323 |
| 2005/0057151 A1* | 3/2005 | Kuwabara | H05B 33/22 313/506 |
| 2007/0247851 A1* | 10/2007 | Villard | F21V 29/89 362/294 |
| 2009/0322657 A1 | 12/2009 | Na et al. | |
| 2013/0136949 A1 | 5/2013 | Okuno et al. | |
| 2014/0070182 A1 | 3/2014 | Choi et al. | |
| 2014/0151652 A1* | 6/2014 | Im | H01L 51/5228 257/40 |
| 2014/0197385 A1* | 7/2014 | Madigan | H01L 51/5012 257/40 |
| 2015/0001477 A1* | 1/2015 | Namkung | H01L 27/3258 257/40 |
| 2015/0060820 A1 | 3/2015 | Takagi et al. | |
| 2015/0123952 A1* | 5/2015 | Kim | H01L 51/5271 345/205 |
| 2015/0207094 A1* | 7/2015 | Hwang | H01L 51/525 257/88 |
| 2016/0093833 A1* | 3/2016 | No | H01L 51/5293 257/40 |
| 2016/0118420 A1* | 4/2016 | Yang | H01L 27/1255 257/40 |
| 2016/0126262 A1* | 5/2016 | Tae | H01L 27/1255 257/71 |
| 2016/0190221 A1* | 6/2016 | Cho | H01L 27/1255 257/40 |
| 2016/0204184 A1* | 7/2016 | Park | H01L 27/1255 257/71 |
| 2016/0211273 A1* | 7/2016 | Moon | H01L 27/1255 |
| 2016/0211350 A1* | 7/2016 | Koo | H01L 29/66757 |
| 2016/0284733 A1* | 9/2016 | Lee | H01L 27/3262 |
| 2016/0351649 A1 | 12/2016 | Li | |
| 2017/0062528 A1* | 3/2017 | Aoyama | G02F 1/133514 |
| 2017/0062769 A1* | 3/2017 | Kim | H01L 51/5275 |
| 2017/0062770 A1* | 3/2017 | Jang | H01L 51/5271 |
| 2017/0084676 A1* | 3/2017 | Jang | H01L 51/5275 |
| 2017/0084857 A1* | 3/2017 | Song | H01L 27/3213 |
| 2017/0125508 A1* | 5/2017 | Kim | H01L 51/5221 |
| 2017/0125738 A1* | 5/2017 | Kim | H01L 51/5225 |
| 2017/0141172 A1* | 5/2017 | Cho | H01L 27/3246 |
| 2017/0154934 A1* | 6/2017 | Kim | H01L 51/525 |
| 2017/0200776 A1* | 7/2017 | Park | H01L 51/5228 |
| 2017/0205959 A1* | 7/2017 | Seong | H01L 51/5271 |
| 2017/0301743 A1* | 10/2017 | Yang | H01L 27/1225 |
| 2017/0317154 A1* | 11/2017 | Heo | H01L 27/3262 |
| 2018/0019434 A1* | 1/2018 | Park | H01L 51/5228 |
| 2018/0076394 A1* | 3/2018 | Kawakami | H01L 51/0065 |
| 2018/0085859 A1* | 3/2018 | Yamazaki | H01L 51/003 |
| 2018/0097049 A1 | 4/2018 | Choi et al. | |
| 2018/0190719 A1* | 7/2018 | Kim | H01L 51/5225 |
| 2018/0190932 A1 | 7/2018 | Koo et al. | |
| 2018/0211979 A1 | 7/2018 | Lee et al. | |
| 2018/0247987 A1* | 8/2018 | Jang | H01L 27/3246 |
| 2018/0261794 A1 | 9/2018 | Choi et al. | |
| 2018/0277611 A1* | 9/2018 | Song | H01L 27/3213 |
| 2018/0299603 A1* | 10/2018 | Lee | H01L 51/5281 |
| 2018/0358581 A1* | 12/2018 | Kim | H01L 27/3248 |
| 2018/0366524 A1* | 12/2018 | Bang | H01L 51/0021 |
| 2019/0067381 A1* | 2/2019 | Kim | H01L 27/3246 |
| 2019/0067642 A1* | 2/2019 | Kim | H01L 27/3246 |
| 2019/0131589 A1* | 5/2019 | Matsueda | H01L 27/3276 |
| 2019/0165323 A1* | 5/2019 | Jo | H01L 51/5225 |
| 2019/0267439 A1* | 8/2019 | Jang | H01L 27/3258 |
| 2019/0312233 A1* | 10/2019 | Kim | H01L 51/5275 |
| 2019/0332841 A1* | 10/2019 | Zhou | G09G 3/3233 |
| 2020/0227672 A1* | 7/2020 | Liu | H01L 27/3276 |

FOREIGN PATENT DOCUMENTS

| | | |
|---|---|---|
| JP | 2012-094485 A | 5/2012 |
| JP | 2012-113934 A | 6/2012 |
| JP | 2015-050011 A | 3/2015 |
| KR | 10-0552962 B1 | 2/2006 |
| KR | 10-2013-0007421 A | 1/2013 |
| KR | 10-2017-0015732 A | 2/2017 |
| KR | 10-2018-0036465 A | 4/2018 |
| KR | 10-2018-0078128 A | 7/2018 |
| KR | 10-2018-0087908 A | 8/2018 |
| TW | 201338151 A | 9/2013 |

OTHER PUBLICATIONS

Office Action, Japan Patent Office Application No. JP2019-227428, dated Dec. 1, 2020, 16 pages.
Office Action, Taiwan Intellectual Property Office Patent Application No. 108144342, dated Sep. 21, 2020, 19 pages.
European Office Action, European Patent Office Application, No. 19216945.6, dated Apr. 5, 2022, 16 pages.

* cited by examiner

DISPLAY PANEL

CROSS-REFERENCE TO RELATED APPLICATION

This application claims the priority benefit of Republic of Korea Patent Application No. 10-2018-0163602, filed on Dec. 17, 2018 in the Korean Intellectual Property Office, the disclosure of which is incorporated herein by reference in its entirety.

BACKGROUND

Field of the Disclosure

The present disclosure relates to a display device and a display device including the same.

Description of the Background

As the advent of information society, there have been growing needs for various display panels for using in display devices, lighting devices, or the like. Among various display panels and display devices including the display panels, there is an increasing demand for organic light emitting display panels which are advantageous in a reduction in overall weight and thickness because the organic light emitting display panels does not require an additional light source.

However, when the organic light emitting display panel including an organic light emitting layer emitting light is operated, a light extraction efficiency of the organic light emitting display panel may be decreased and corresponding luminance efficiency may be lowered because some of the light emitted from the organic light emitting layer cannot be emitted outside the organic light emitting display panel, and becomes trapped inside the organic light emitting display device.

SUMMARY

Embodiments relate to a display panel comprising an overcoat layer, a first electrode, a bank layer, an organic light emitting layer, a second electrode and a transistor. The overcoat layer has a first flat area having a first thickness, a second flat area having a second thickness thicker than the first thickness, and an inclined area between the first flat area and the second flat area. The first electrode is on the first flat area, the inclined area and at least a part of the second flat area of the overcoat layer. The first electrode is reflective of light and has an inclined surface on the inclined area of the overcoat layer. The bank layer covers a portion of the first flat area of the overcoat layer, the inclined area of the overcoat layer, and at least a portion of the second flat area of the overcoat layer. The organic light emitting layer is on the first electrode. The second electrode is on the organic light emitting layer and the bank layer. At least part of a transistor overlaps the first flat area of the overcoat layer. The transistor has at least a terminal connected to the first electrode through a contact hole under the bank layer and located outside the first flat area.

In one or more embodiments, a thickness of the bank layer in the first area in a direction parallel to a surface of a substrate is less than or equal to 3.2 µm.

In one or more embodiments, the thickness of the bank layer in the first area is larger than or equal to 0.1 µm.

In one or more embodiments, a difference between the first thickness and the second thickness is larger than or equal to 0.7 µm.

In one or more embodiments, a difference between the first thickness and the second thickness is less than or equal to 10 µm.

In one or more embodiments, the first area has a polygonal shape.

In one or more embodiments, the polygonal shape is an octagonal shape.

In one or more embodiments, the bank layer is transparent to visible light.

In one or more embodiments, the first electrode comprises a conductive metal oxide layer and a reflective metal layer on the conductive metal oxide layer.

In one or more embodiments, the bank layer contacts a portion of the first electrode that is not covered by the bank in the first area.

In one or more embodiments, the organic light emitting layer extends from the first area to the second area via the inclined area, the bank layer between the organic light emitting layer and the first electrode in the inclined area and the second area.

In one or more embodiments, a portion of the bank layer is on the inclined portion of the inclined surface of the first electrode, a portion of the organic light emitting layer on the portion of the bank layer is thinner than another portion of the organic light emitting layer contacting the first electrode in the first area.

Embodiments also relate to a display panel including an overcoat layer on a substrate, a first electrode on the overcoat layer, a bank layer covering a portion of the first electrode but exposing at least another portion of the first electrode, an organic light emitting layer on the first electrode, and a second electrode on the organic light emitting layer and the bank layer. The first electrode is reflective of light and has an inclined surface. A first portion of light is emitted from the organic light emitting layer through a flat area of the second electrode. A second portion of light is emitted from the organic light emitting layer and reflected by the inclined area separated from the first portion of light.

In one or more embodiments, the portion of the first electrode contacts a transistor via a contact hole under the bank layer.

In one or more embodiments, the overcoat layer has a first thickness at a portion under the organic light emitting layer and has a second thickness that is thicker than the first thickness at another portion not under the organic light emitting layer.

In one or more embodiments, the first portion of light from a sub-pixel forms a main area on a viewing plane and the second portion of light from the sub-pixel forms a supplemental area surrounding the main area in the viewing plane.

In one or more embodiments, the supplemental areas is formed for sub-pixels of only one or two colors.

In one or more embodiments, the supplemental area is discontinuous.

In one or more embodiments, the supplemental area has a shape of a closed curve.

In one or more embodiments, at least one of brightness, shape and color coordinate of the supplemental area for the sub-pixel is different for another sub-pixels of a different color.

In one or more embodiments, the display panel further comprises auxiliary electrodes connected to a subset of sub-pixels, wherein the auxiliary electrodes are outside an area where the organic light emitting layer is present.

In one or more embodiments, the display panel further comprises a storage capacitor at least a part of which overlaps the inclined surface.

DETAILED DESCRIPTION

Figure 1:
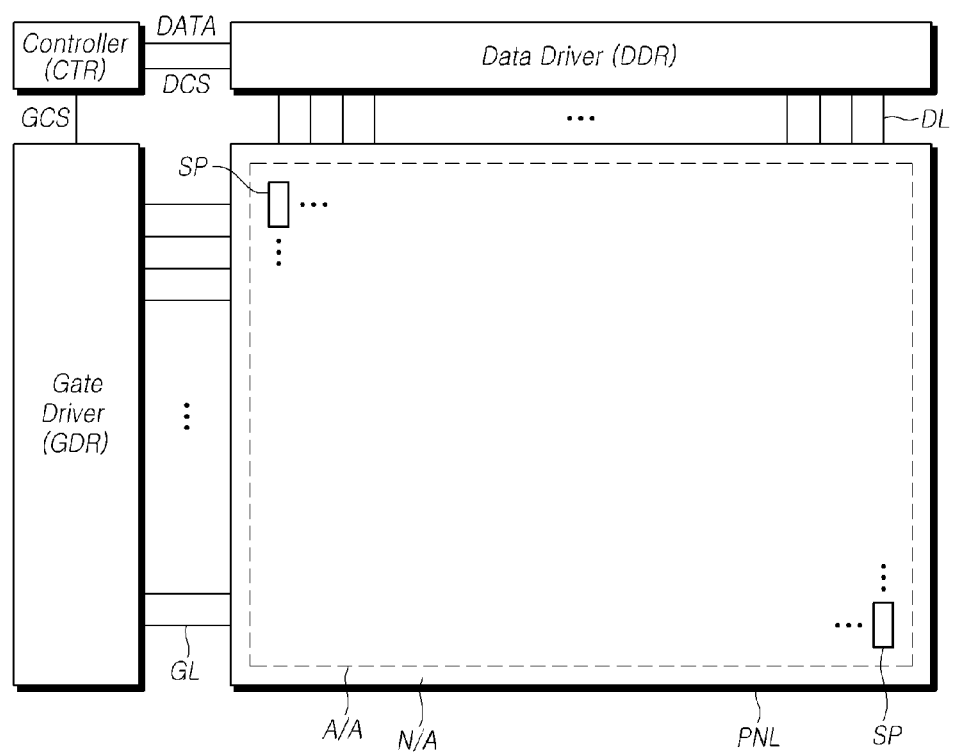
FIG. 1 is a block diagram schematically illustrating a display device according to embodiments of the present disclosure.

Hereinafter, the present preferred embodiments of the disclosure will be described in detail with reference to the accompanying drawings. In denoting elements of the drawings by reference numerals, the same elements will be referenced by the same reference numerals although the elements are illustrated in different drawings. Further, in the following description of the disclosure, detailed description of known functions and configurations incorporated herein may be omitted when it may make the subject matter of the disclosure rather unclear.

Terms, such as first, second, A, B, (a), or (b) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. When it is described that an element is "located", "disposed", "arranged", "formed", or the like over another element, it should be interpreted that not only the element is directly contacted on the another element, but further another element may be "interposed" between the element and the another element.

That is, it is noted that a connection or a coupling between an element and another element may be described in such a manner that the element is located, disposed, or formed over the another element, as an equivalent meaning.

FIG. 1 is a block diagram schematically illustrating a configuration of a display device according to embodiments of the present disclosure. The display device according to embodiments of the present disclosure may be a display device with a display panel, or may further include or be included in a lighting device/apparatus/system, a luminescence device/apparatus/system, or the like. Hereinafter, for convenience of description and ease of the understanding, discussions are conducted based on the display device with the display panel. However, the following description may be applicable to identically or similarly to various devices/apparatuses/systems with functionalities for displaying images, such as, the lighting device/apparatus/system, the luminescence device/apparatus/system, or the like.

In accordance with embodiments of the present disclosure, the display device may include a panel PNL for displaying images or emitting light, and a driving circuit (or driver) for driving the panel PNL.

The panel PNL may include a plurality of data lines DL and a plurality of gate lines, and include a plurality of subpixels SP that is defined by the plurality of data lines DL and the plurality of gate lines GL and that is arranged in a matrix form.

The plurality of data lines DL and the plurality of gate lines GL may cross each other and be arranged in the panel PNL. For example, the plurality of gate lines GL may be arranged in a first direction or on one of a row or a column, and the plurality of data lines DL may be arranged in a second direction or on the other of the row or the column. Hereinafter, for convenience of description and ease of the understanding, discussions are conducted on an example of the plurality of gate lines GL arranged on a row and the plurality of data lines DL arranged on a column.

Depending on a structure or arrangements of subpixels, one or more types of signal line may be disposed other than the plurality of data lines DL and the plurality of gate lines GL. For example, the display panel may further include at least one driving voltage line, at least one reference voltage line, at least one common voltage line, or the like.

The panel PNL may be various types of panel, such as a liquid crystal display LCD panel, an organic light emitting diode OLED panel, or the like.

For example, one or more different types of signal line may be disposed in the panel PNL depending on a structure of subpixels, a type of panel (e.g., LCD panel, OLED panel, or the like), or the like. In the present disclosure, the signal line may denote a term including an electrode to which a signal is applied.

The panel PNL may include an active area A/A for displaying an image and a non-active area N/A for not displaying an image. Here, the non-active area N/A may be referred to as a bezel area or an edge area of the panel or the display device.

A plurality of subpixels SP is arranged in the active area A/A for displaying images.

At least one pad, such as conductive trace, electrically connected to a data driver DDR is disposed in the non-active area N/A, and a plurality of data link lines may be disposed in the non-active area N/A for electrically connecting the pad to the plurality of data lines DL. In this case, the plurality of data link lines may be a part of the plurality of data lines DL extending to the non-active area N/A, or be separate patterns electrically connected to the plurality of data lines DL.

In addition, the non-active area N/A further may include gate-driving-related lines for delivering a voltage (signal) needed for driving at least one gate of at least one transistor for driving at least one subpixel from the pad electrically connected to the data driver DDR to a gate driver GDR. For example, the gate-driving-related lines may include clock lines for delivering clock signals, gate voltage lines for delivering gate voltages (VGH, VGL), gate driving control signal lines for delivering various control signals needed for generating scan signals, or the like. The gate-driving-related lines are arranged in the non-active area N/A, unlike gate lines GL arranged in the active area A/A.

The driving circuit may include the data driver DDR for driving the plurality of data lines DL, the gate driver GDR for driving the plurality of gate lines GL, and a controller CTR for controlling the data driver DDR and the gate driver GDR.

The data driver DDR may drive the plurality of data lines DL by outputting data voltages to the plurality of data lines DL.

The gate driver GDR may drive the plurality of gate lines GL by outputting scan signals to the plurality of gate lines GL.

The controller CTR may provide various control signals DCS, GCS needed for driving and/or operating the data driver DDR and the gate driver GDR, and control the driving and/or operating of the data driver DDR and the gate driver GDR. In addition, the controller CTR may provide image data DATA to the data driver DDR.

The controller CTR starts scanning operation according to timing processed in each frame, converts image data input from other devices or image providing sources to a data signal form used in the data driver DDR and then outputs resulting image data from the converting, and controls the driving of at least one data line at a pre-configured time aligned with the scanning operation.

In order to control the data driver DDR and the gate driver GDR, the controller CTR receives a timing signal, such as, a vertical synchronous signal Vsync, a horizontal synchronous signal Hsync, an input data enable DE signal, a clock signal CLK, or the like, from other devices or image providing sources, such as, a host system, and generates various control signals and outputs the generated signals to the data driver DDR and the gate driver GDR.

For example, to control the gate driver GDR, the controller CTR outputs various gate control signals GCS including a gate start pulse GSP, a gate shift clock GSC, a gate output enable signal GOE, or the like.

In addition, to control data driver (DDR), the controller CTR outputs various data control signals DCS including a source start pulse SSP, a source sampling clock SSC, a source output enable signal SOE, or the like.

The controller CTR may be a timing controller used in the typical display technology or a control apparatus/device capable of additionally performing other control functionalities in addition to the typical function of the timing controller.

The controller CTR may be implemented as a separate unit from the data driver DDR, or integrated with the data driver DDR and implemented as an integrated circuit.

The data driver DDR receives image data DATA form the controller CTR, and provides data voltages to the plurality of data lines DL. Thus it is possible for the data driver DDR to drive the plurality of data lines DL. Herein, the data driver DDR may also be referred to as a "source driver."

The data driver DDR may transmit various signals to and/or receive them from the controller CTR through various interfaces.

The gate driver GDR sequentially drives the plurality of gate lines GL by sequentially providing scan signals to a plurality of gate lines GL. Herein, the gate driver GDR may also be referred to as a "scan driver."

According to controlling of the controller CTR, the gate driver GDR sequentially provide a scan signal, such as an on-voltage or an off-voltage to the plurality of gate lines GL.

When a specific gate line is asserted by a scan signal from the gate driver GDR, the data driver DDR converts image data received from the controller into analog data voltages and provides the resulted analog data voltages to the plurality of data lines DL.

The data driver DDR may be located on, but not limited to, only one side (e.g., top side or bottom side) of the panel PNL, or in some embodiments, be located on, but not limited to, two sides (e.g., top side and bottom side) of the panel PNL according to driving schemes, panel design schemes, or the like.

The gate driver GDR may be located on, but not limited to, only one side (e.g., left side or right side) of the panel PNL, or in some embodiments, be located on, but not limited to, two sides (e.g., left side and right side) of the panel PNL according to driving schemes, panel design schemes, or the like.

The data driver DDR may be implemented by including one or more source driver integrated circuits SDIC.

Each source driver integrated circuits SDIC may include a shift register, a latch circuit, a digital to analog converter DAC, an output buffer, or the like. In some embodiments, the data driver DDR may further include one or more analog to digital converters ADC.

Each source driver integrated circuit SDIC may be connected to the pad, such as a bonding pad, of the panel PNL in a tape automated bonding TAB type or a chip on glass COG type, or be directly disposed on the panel PNL. In some embodiments, each source driver integrated circuit SDIC may be integrated and disposed on the panel PNL. In addition, each source driver integrated circuit SDIC may be implemented in a chip on film type. In this case, each source driver integrated circuit SDIC may be mounted on a circuit film and electrically connected to the data lines DL arranged in the panel PNL through the circuit film.

The gate driver GDR may include a plurality of gate driving circuits GDC. Herein, the plurality of gate driving circuits GDC each may correspond to the respective plurality of gate lines GL.

Each gate driving circuit GDC may include a shift register, a level shifter, and the like.

Each gate driving circuit GDC may be connected to the pad, such as a bonding pad, of the panel PNL in a tape automated bonding TAB type or a chip on glass COG type. In addition, each gate driving circuit GDC may be implemented in a chip on film type. In this case, each gate driving circuit GDC may be mounted on a circuit film and electrically connected to the gate lines GL arranged in the panel PNL through the circuit film. In addition, each gate driving circuit GDC may be integrated into the panel PNL in a gate in panel GIP type. That is, each gate driving circuit GDC may be directly formed in the panel PNL.

Figure 3:
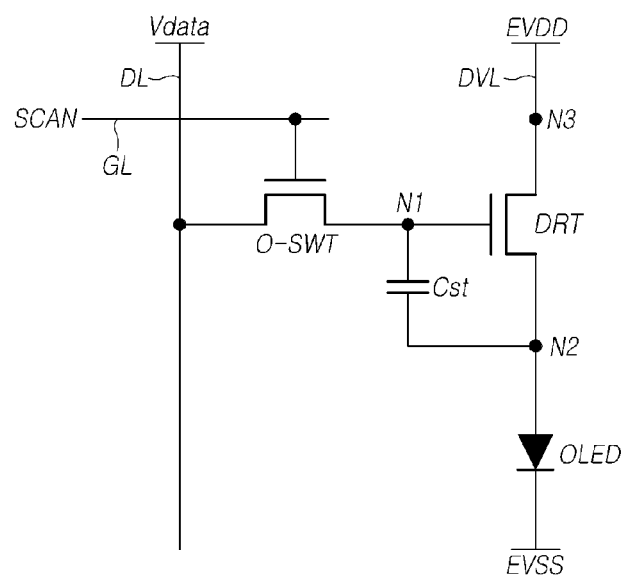
FIG. 3 is a view illustrating a structure of a subpixel in case the display panel is configured with an organic light emitting diode (OLED) panel, according to embodiments of the present disclosure.

FIG. 3 is a view illustrating a structure of a subpixel arranged in an organic light emitting diode OLED panel, according to embodiments of the present disclosure. Referring to FIG. 3, each subpixel SP may be implemented by electronic elements arranged in the OLED panel 110 including, but not limited to, an organic light emitting diode OLED, a driving transistor DRT for driving the organic light emitting diode OLED, a switching transistor O-SWT electrically connected between a first node N1 of the driving transistor DRT and a corresponding data line DL, a storage capacitor Cst electrically connected between the first node N1 and a second node N2 of the driving transistor DRT, or the like.

The organic light emitting diode OLED may include an anode electrode, an organic light emitting layer, a cathode electrode, and the like.

Figure 2:
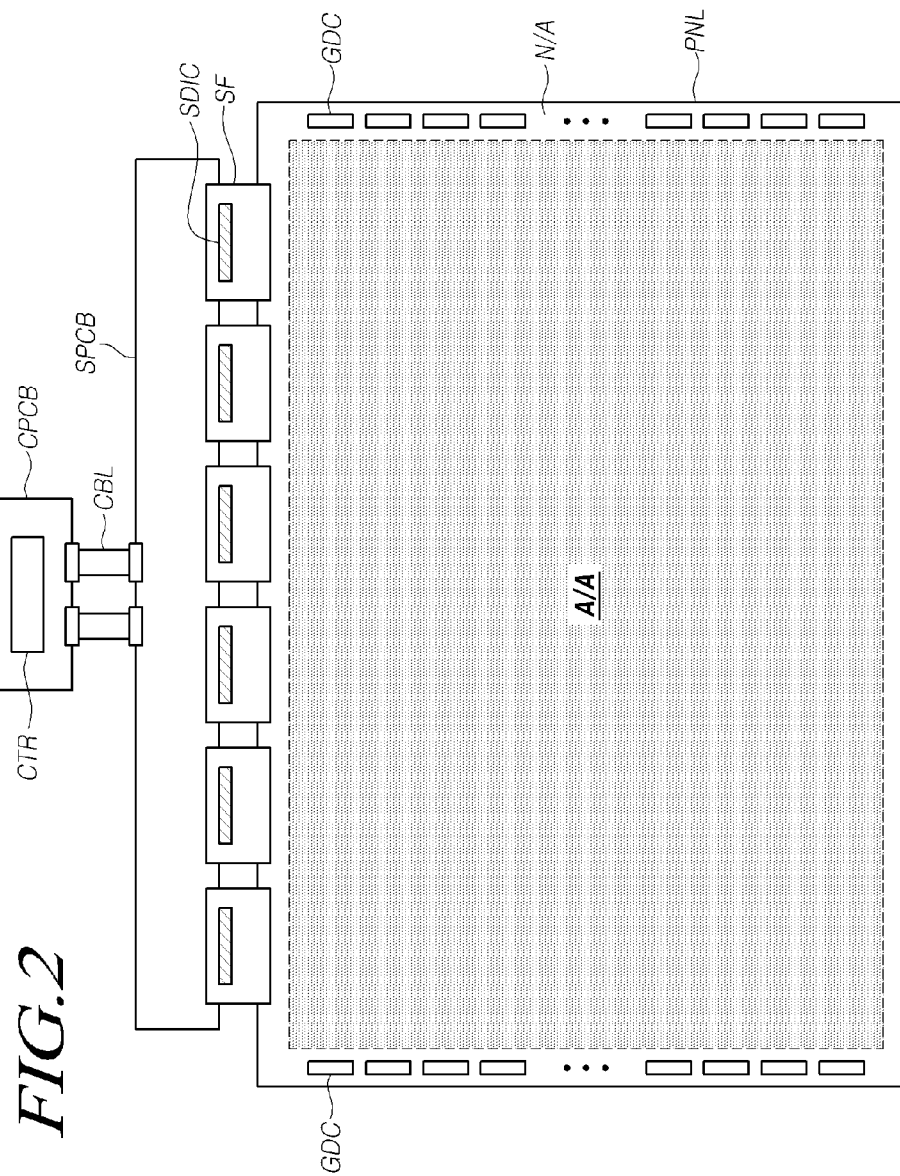
FIG. 2 is a view schematically illustrating a system implementation of the display device according to embodiments of the present disclosure.

FIG. 2 is a view schematically illustrating a system implementation of the display device according to embodiments of the present disclosure. Referring to FIG. 2, in a display device according to embodiments of the present disclosure, a data driver DDR may be implemented in the chip on film COF type of various types, such as, TAB, COG, COF, GIP, or the like. Also, a gate driver GDR may be implemented in the gate in panel GIP type of various types, such as, TAB, COG, COF, GIP, or the like.

The data driver DDR may be implemented as one or more source driver integrated circuits SDIC. FIG. 2 shows an embodiment in which the data driver DDR is implemented as a plurality of source driving integrated circuits SDIC.

In case the data driver DDR is implemented in the COF type, each source driving integrated circuit SDIC served as the data driver DDR may be mounted on a source side circuit film SF.

One side of the source side circuit film SF may be electrically connected to the pad, such as an array of pads, disposed in the non-active area N/A.

One or more lines electrically connecting between the source driving integrated circuit SDIC and the panel PNL may be arranged on the source side circuit film SF.

For circuit connections between the plurality of source driving integrated circuits SDIC and other units or electronic elements, the display device may include one or more source printed circuit board SPCB, and a control printed circuit board CPCB for mounting several units used for controlling the display device and other elements/units/devices.

The other side of the source side circuit film SF in which the source driving integrated circuit SDIC is mounted may be connected to the one or more source printed circuit board SPCB.

That is, the one side and the other side of the source side circuit film SF contained of the source driving integrated circuit SDIC may be electrically connected to the non-active area N/A of the panel PNL and the one or more source printed circuit board SPCB, respectively.

The controller CTR for controlling the data driver DDR, the gate driver GDR, or the like may be disposed on the control printed circuit board CPCB.

In addition, the control printed circuit board CPCB may further include a power management integrated circuit PMIC that provides various voltages or currents or controls various voltages or currents to be provided, to the panel PNL, the data driver DDR, the gate driver GDR, and the like.

The source printed circuit board SPCB and the control printed circuit board CPCB may be connected to each other in a circuit through at least one connection unit CBL. Here, connection unit CBL may be a flexible printed circuit FPC, a flexible flat cable, or the like.

One or more source printed circuit board SPCB and the control printed circuit board CPCB may be integrated into one printed circuit board.

In case the gate driver GDR is implemented in the gate in panel GIP type, a plurality of gate driving circuits GDC included in the gate driver GDR may be directly formed in the non-active area N/A of the panel PNL.

Each of the plurality of gate driving circuits GDC may output scan signals to corresponding gate lines arranged in the active area A/A of the panel PNL.

The plurality of gate driving circuits GDC arranged in the panel PNL may receive various signals (a clock signal, a high level gate voltage VGH, a low level gate voltage VGL, a start signal VST, a reset signal RST, or the like) needed for generating the scan signals through gate-driving-related lines disposed in the non-active area N/A.

The gate-driving-related lines disposed in the non-active area N/A may be electrically connected to the source side circuit film SF disposed closest to a plurality of gate driving circuits GDC.

FIG. 3 is a view illustrating a structure of a subpixel arranged in an organic light emitting diode OLED panel, according to embodiments of the present disclosure. Referring to FIG. 3, each subpixel SP in the OLED panel 110 may be implemented by electronic elements including, but not limited to, an organic light emitting diode OLED, a driving transistor DRT for driving the organic light emitting diode OLED, a switching transistor O-SWT electrically connected between a first node N1 of the driving transistor DRT and a corresponding data line DL, a storage capacitor Cst electrically connected between the first node N1 and a second node N2 of the driving transistor DRT, or the like.

The organic light emitting diode OLED may include an anode electrode, an organic light emitting layer, a cathode electrode, and the like.

Referring to FIG. 3, an anode electrode (also referred to as a pixel electrode) of the organic light emitting diode OLED may be electrically connected to a second node N2 of a driving transistor DRT. A low voltage EVSS may be applied to a cathode electrode (also referred to as a common electrode) of the organic light emitting diode OLED.

Herein, the low voltage EVSS may be a ground voltage or a voltage higher or lower than the ground voltage. In addition, a value of the low voltage EVSS may be varied depending on a driving state. For example, values of low voltage EVSS when image driving is performed and when sensing driving is performed may be differently set from each other.

The driving transistor DRT drives the organic light emitting diode OLED by providing driving currents to the organic light emitting diode OLED.

The driving transistor DRT may include a first node N1, a second node N2 a third node N3, and the like.

The first node N1 of the driving transistor DRT may be a gate node, and may be electrically connected to a source node or a drain node of the switching transistor O-SWT. The second node N2 of the driving transistor DRT may be a source node or a drain node, and electrically connected to the anode electrode (or cathode electrode) of the organic light emitting diode OLED. The third node N3 of the driving transistor DRT may be the drain node or the source node. A driving voltage EVDD may be applied to the third node N3 that may be electrically connected to a driving voltage line DVL providing the driving voltage EVDD.

The storage capacitor Cst may be electrically connected between the first node N1 and the second node N2 of the driving transistor DRT and may maintain a data voltage Vdata corresponding to an image signal voltage or a corresponding voltage for one frame time (or a pre-configured time).

The drain node or the source node of the switching transistor O-SWT is electrically connected to a corresponding data line, and the source node or the drain node of the switching transistor O-SWT is electrically connected to the first node N1 of the driving transistor DRT, and the gate node of the switching transistor O-SWT is electrically connected to a corresponding gate line, and thereby can receive scan signal SCAN.

On-off operation of the switching transistor O-SWT may be controlled by a scan signal SCAN input to the gate node of the switching transistor O-SWT through a corresponding gate line.

The switching transistor O-SWT may be turned on by the scan signal SCAN, may transfer a data voltage Vdata provided from a corresponding data line DL to the first node N1 of the driving transistor DRT.

Meanwhile, the storage capacitor Cst may be an external capacitor configured to be located outside of the driving transistor DRT other than an internal capacitor, that is, a parasitic capacitor (e.g., Cgs, Cgd), that presents between the first node N1 and the second node N2 of the driving transistor DRT.

Each of the driving transistor DRT and the switching transistor O-SWT may be an n-type transistor or a p-type transistor.

As shown in FIG. 3, two transistors (2T) and one capacitor (1C) type of subpixel structure is discussed for convenience of discussion, but the embodiments are not limited thereto. In some embodiments, the subpixel may further include one or more transistors and/or one or more capacitors. In some embodiments, a plurality of subpixels may have an identical structure, or one or more of the plurality of subpixels may have different structure from others.

Figure 4:
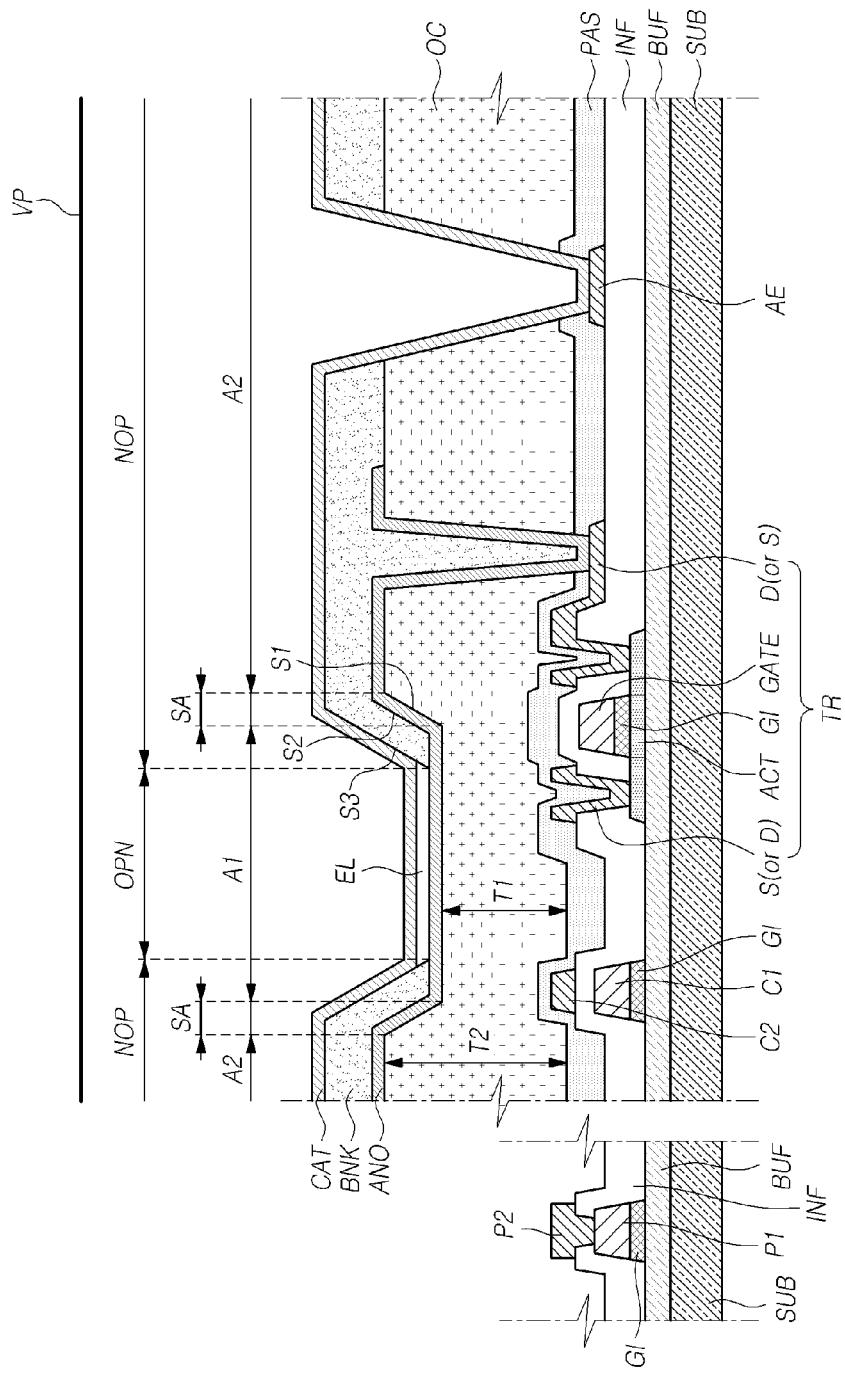
FIG. 4 is a cross-sectional view illustrating the display device according to embodiments of the present disclosure.

FIG. 4 is a cross-sectional view illustrating the display device according to embodiments of the present disclosure. Referring to FIG. 4, the display panel according to embodiments of the present disclosure may include a substrate SUB, an overcoat layer OC located over the substrate, an anode electrode ANO located on the overcoat layer, a bank layer BNK located on a reflective electrode, an organic light emitting layer EL located on the reflective electrode, and a cathode electrode CAT located on the organic light emitting layer and the bank layer.

The overcoat layer OC may be referred to as a planarization layer for enabling one or more pixels to be arranged over an array of transistors. The overcoat layer may include a first area A1 (also referred to as a "first flat area" herein), a second area A2 and an inclined area SA. A part of the second area A2 adjacent to the inclined area SA and having a top flat surface is referred to as a "second flat area" herein.

The second area A2 may be thicker than the first area A1. The second area A2 may be an area surrounding the first area. The inclined area SA may be located between the first area and the second area, and may include a first inclined surface S1 connecting between the first area and the second area.

In defining a thickness of each area of the overcoat layer, the thickness of each area means the thickness of the overcoat layer disposed over the substrate of the transistor. The thickness of each area may be defined as the thickness of the overcoat layer measured between a passivation layer PAS disposed directly under the overcoat layer OC and the anode electrode ANO disposed directly on the overcoat layer OC, in each area. In particular, the thickness of each area may be defined as the thickest thickness of the overcoat layer measured in each area except for a portion in which a contact hole, or the like is introduced.

As shown in FIG. 4, the thickness of the first area T1 may be smaller than that of the second area T2. Therefore, the first area A1 may form a concave portion of the overcoat layer and the second area A2 may form a convex portion of the overcoat layer.

The overcoat layer including the first area A1, the second area A2 and the inclined area SA may be formed through a photolithography process using a half-tone mask.

A shape of the first area A1 may be, but not limited to, a polygonal shape such as a circle or a square, a pentagon, and an octagon. The second area A2 may surround the first area A1, and may form a side wall surrounding the side portion of the first area A1 having the shape described above.

Both the first area A1 and the second area A2 may be connected to the inclined area SA formed by a difference between thickness of the first area A1 and the thickness of the second area A2. The inclined area SA may include the first inclined surface S1.

Accordingly, the overcoat layer may have a shape such that the second area A2 having the convex portion surrounds around the first area A1 having the concave portion, and the first area A1 and the second area A2 are connected to each other by the inclined area S1 having a pre-configured degree and height.

The anode electrode ANO may be located on the overcoat layer OC and formed along the surface of the overcoat layer.

This forming of the anode electrode ANO along the surface of the overcoat layer OC may mean that the reflective electrode is formed on the overcoat layer with a thickness that is considered to be uniform when a thickness variation due to a tolerable process deviation is taken into account.

As described above, the overcoat layer may have a shape such that the second area A2 having the convex portion surrounds around the first area A1 having the concave portion, and the first area A1 and the second area A2 are connected to each other by the inclined surface S1 having a pre-configured degree and height. In case the reflective electrode is formed along the surface of the overcoat layer as described above, the reflective electrode has a similar shape to the overcoat layer. Thus, the reflective electrode may have a shape such that the inclined surface S1 having a pre-configured angle and height surrounds the concave portion of the reflective electrode.

Accordingly, in case the anode electrode ANO is formed along the surface of the overcoat layer OC, the reflective electrode may include the second inclined surface S2 located on the first inclined surface S1.

This locating of the second inclined surface S2 on the first inclined surface S1 may mean that since the anode electrode ANO is formed along the surface of the overcoat OC, the second inclined surface S2 is formed along the first inclined surface S1.

The anode electrode ANO may be electrically connected to a drain electrode D or a source electrode S of a transistor TR through a contact hole.

The anode electrode may be an electrode including the reflective electrode. The anode electrode may include a conductive metal oxide layer including indium tin oxide ITO and a reflective metal layer including silver. For example, the anode electrode may include a first indium tin oxide ITO layer located on the overcoat layer, the reflective metal layer including silver located on the first indium tin oxide ITO layer, and a second indium tin oxide ITO layer located on the reflective metal layer.

The bank layer BNK may be located on the anode electrode ANO, and at the same time, may be located on the second area A2, the inclined area SA and the first area A1 connected to the inclined area SA. The bank layer BNK may further include a third inclined surface S3 formed along the second inclined surface S2.

The bank layer BNK includes the third inclined surface S3 formed along the second inclined surface S2 of the reflective electrode formed along the first inclined surface S1 of the overcoat layer OC. Therefore, the bank layer may be formed on the second area A2 forming the convex portion of the overcoat layer and the first inclined area S1 of the overcoat layer, resulting in the first area A1 forming the concave portion of the overcoat layer being surrounded by the bank layer.

The organic light emitting layer EL may be located on a portion of the anode electrode which is not covered by the bank layer, and may be located on the first area A1.

The cathode electrode CAT may be located on the organic light emitting layer EL and the bank layer BNK. The display panel may be a top emission type in which light emitted from the organic light emitting layer is emitted through the cathode electrode CAT. Accordingly, the cathode electrode CAT may be a transparent electrode with excellent transmittance to light in the visible light region, and the bank layer BNK may perform a function as a layer for distinguishing between an opening area OPN and a non-opening area NOP of the display panel.

As described above, the display panel in the present disclosure may include two areas that are the opening area OPN and the non-opening area NOP caused by the configuration of the bank layer BNK. The opening area OPN may correspond to an area that is not covered by the bank layer, and the non-opening area NOP may correspond to an area that is covered by the bank layer.

The correspondence of an area to another area may mean a relationship in which an area and another area are considered to be the same, taking into account tolerance that may occur in the manufacturing process of a product.

As described above, the anode electrode ANO, the bank layer BNK, the organic light emitting layer EL and the cathode electrode CAT are located over the overcoat layer OC, and therefore light emitting may be performed in the first area A1 of the overcoat layer in which the anode electrode ANO, the organic light emitting layer EL and the cathode electrode CAT are sequentially stacked. In addition, a portion of the first area A1 of the overcoat layer in which the anode electrode ANO, the organic light emitting layer EL and the cathode electrode CAT are disposed in order is the opening area OPN that is not covered by the bank layer BNK, and therefore light emitting may be performed in the organic light emitting layer EL by the anode electrode ANO exposed to the opening area OPN of the bank layer BNK and electric field formed by the cathode electrode CAT.

On the other hand, light is not emitted from organic light emitting layer EL in an area in which the bank layer BNK is present between the organic light emitting layer EL and the anode electrode ANO due to the bank layer BNK.

In accordance with embodiments of the present disclosure, the display panel may include a buffer layer BUF, an interlayer insulating film INF, a passivation layer PAS, a transistor TR, a storage capacitor C1, C2, an auxiliary electrode (AE, or may be referred to as an auxiliary line), and pad area.

The buffer layer BUF may be disposed on the substrate SUB, and the transistor TR and the storage capacitor C1, C2, and the like may be disposed over the buffer layer BUF.

The interlayer insulating film INF may be located on a gate electrode GATE of the transistor TR, an active layer ACT, a first storage capacitor C1 of the storage capacitor, and a first pad electrode P1 of the pad area.

The passivation layer PAS may be disposed to protect an electric circuit element, such as the auxiliary electrode AE, the storage capacitor C1, C2, the transistor TR, and the like.

The transistor TR may include the activation layer ACT, a gate insulating film GI, a gate electrode GATE, a source electrode S and a drain electrode D. Hereinafter, discussions are conducted on a transistor according to embodiments of the present disclosure. Typical implementations performed in the field of the present disclosure may be used to describe a location relationship between respective elements of the transistor in the present disclosure.

The activation layer ACT may be disposed on the buffer layer BUF.

The gate insulating film GI is disposed on the activation layer ACT, and the gate electrode GATE is disposed on the gate insulating film GI. Therefore, the gate insulating film GI may be located between the activation layer ACT and the gate electrode GATE.

Each of the source electrode S and the drain electrode D may be disposed on respective portions of the activation layer ACT, and spaced apart from each other. The drain electrode D may be connected to the first electrode ANO through a contact hole CH. By placing the contact hole CH in the second area A2, which is outside the first area A1 on which the first electrode ANO comes into contact with the organic light emitting layer (EL), the presence of the contact hole CH does not negatively affect the flatness of the first electrode ANO. Hence, the light emission quality of the subpixels are maintained consistent and reliably compared to cases where the contact hole CH is located in the first area A1. At least a portion of the bank layer BNK is inserted into the contact hole CH on the first electrode ANO. A depth T3 of the bank layer BNK from the top of the bank layer BNK to the bottom of the contact hole CH is larger than the thickness T1 of the overcoat layer OC and the thickness T2 of the overcoat layer OC.

The transistor TR may function as a driving transistor DRT included in the panel, and drive the OLED included in the panel. By placing at least a portion of the transistor TR in the first area A1 instead of placing the transistor TR only in the second area A2 (as illustrated in FIG. 4), space in the second area A2 may become available to accommodate other circuit components such as other transistors, wires and capacitors in the second area A2. Therefore, such placement of the transistor TR may facilitate increase in the density of the subpixels.

As shown in FIG. 4, the storage capacitor C1, C2 may be disposed in the active area A/A. The storage capacitor C1, C2 may include a first storage capacitor electrode C1 disposed in an identical layer to the gate electrode GATE and a second storage capacitor electrode C2 disposed in an identical layer to the source electrode S and the drain electrode D, but the structure of the storage capacitor C1, C2 of the present disclosure is not limited thereto. The storage capacitor C1, C2 is placed at least partially placed in the first area A1. This is advantageous, among other reasons, because space is made in the second area A2 to accommodate other circuit components in the second area A2, and thereby facilitate the increase of the density of subpixels.

In addition, as shown in FIG. 4, the auxiliary electrode AE contacted to the anode electrode ANO may be further disposed in the active area A/A.

Specifically, the auxiliary electrode AE may be disposed on the interlayer insulating film INF. The passivation layer PAS, an overcoat layer OC and the bank layer BNK may have a hole that does not cover the auxiliary electrode AE. The cathode CAT may contact the auxiliary electrode AE through the hole of the passivation layer PAS, overcoat layer OC and the bank layer BNK.

For example, in case the organic light emitting display panel is a display panel having a large size, voltage drop due to the resistance of the anode electrode ANO may occur, resulting in a luminance difference between the outer edge and the center of the panel. However, in the organic light emitting display panel according to the present disclosure, it is possible to overcome voltage drop occurring through the auxiliary electrode AE contacted to the anode electrode ANO. Thus, in case the organic light emitting display panel according to embodiments of the present disclosure is a panel having a large size, it is possible to prevent the panel from the occurrence of the luminance difference.

FIG. 4 shows that one auxiliary electrode AE is disposed in one subpixel SP, but present disclosure is not limit thereto. For example, one auxiliary electrode AE may be disposed per a plurality of subpixels SP basis. In one or more embodiments, the auxiliary electrode AE may be connected to subpixel SP only at the edges of the display panel.

As another example, in case the organic light emitting display panel according to embodiments of the present disclosure is not a panel having a large size, the panel may not include the auxiliary electrode AE.

In addition, the display panel according to embodiments of the present disclosure may include a pad area disposed in the non-active area. A plurality of pad electrodes P1 and P2 may be disposed in the pad area. For example, a first pad electrode P1 may be disposed on a plurality of insulating films BUF and GI disposed in the pad area. The interlayer insulating film INF that does not cover a portion of a top surface of the first pad electrode P1 may be disposed on the first pad electrode P1. A second pad electrode P2 contacted to the first pad electrode P1 may be disposed on the first pad electrode P1 and the interlayer insulating film INF.

FIG. 4 also illustrates a viewing plane VP at which the light emitted from the display panel is captured. The viewing plane may be located at a distance from the display panel. An example of the image representing light emitted from the display panel is illustrated in FIG. 7B.

Although not shown in FIG. 4, various circuit films, or the like may be electrically connected to the second pad electrode P2.

A viewing plane VP is illustrated in FIG. 4. The viewing plane VP is a plane onto which the light from the display is projected. The light projected onto the viewing plane VP is illustrated in FIG. 7B.

Figure 5:
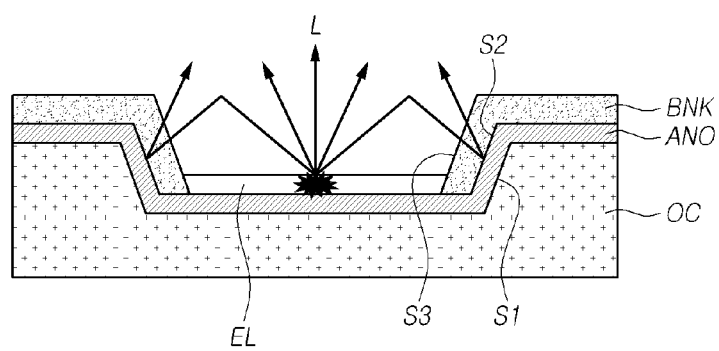
FIG. 5 is a view illustrating light emitted from an organic light emitting layer of the display panel reflected from a second inclined surface, according to embodiments of the present disclosure.

FIG. 5 is a view illustrating that light emitted from an organic light emitting layer of the display panel reflected from a second inclined surface, according to embodiments of the present disclosure. Referring to FIG. 5, light emitted from the organic light emitting layer EL is emitted in various directions without directionality. In particular, some of the light emitted from the organic light emitting layer EL may undergo total reflection and travel toward third inclined surface S3 of the bank layer BNK, while traveling from a layer (not shown) with a high refractive index to a layer (not shown) with a low refractive index.

The bank layer BNK is formed from a material that is transparent to visible light wavelength band. Accordingly, light emitted toward the third inclined surface S3 of the bank layer BNK may go through the third inclined surface S3 of the bank layer BNK, and then reach the second inclined surface S2 of the anode electrode ANO.

Light having reached the second inclined surface S2 of the anode electrode ANO is reflected from the second inclined surface S2, and then may travel toward the third inclined surface S3 of the bank layer BNK and exit the display panel. Accordingly, as described above, in the display panel according to embodiments of the present disclosure, the second inclined surface S2 of the reflective electrode formed on the first inclined surface S1 enables light emitted from the organic light emitting layer EL to travel toward an upper portion of the display panel, resulting in improvement in the luminous efficiency of the display panel.

Figure 6:
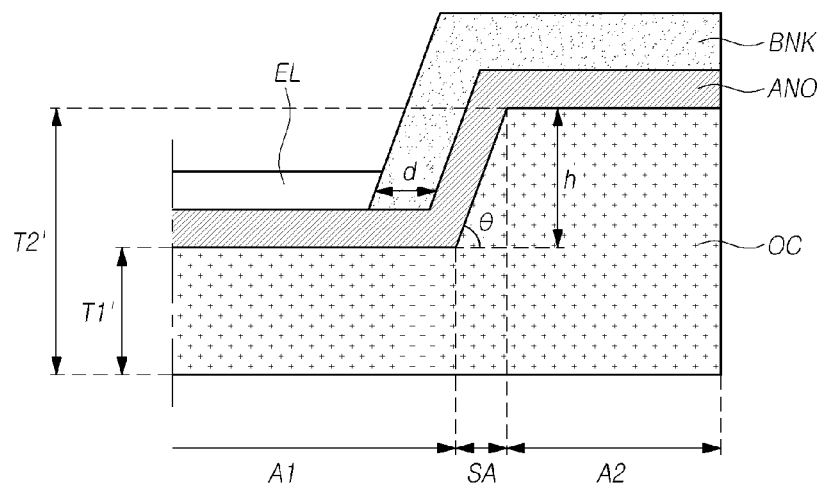
FIG. 6 is an expanded cross-sectional view illustrating a part of the display device according to embodiments of the present disclosure.

FIG. 6 is an expanded cross-sectional view of the first inclined surface S1, the second inclined surface S2 and the third inclined surface S3 of the display device according to embodiments of the present disclosure. Referring to FIG. 6, an angle between the first area A1 and the first inclined surface S1 is represented as $\theta$ (hereinafter, referred to as "$\theta$"), a horizontal distance between the second inclined surface S2 and the third inclined surface S3 is represented as d (hereinafter, referred to as "d"), and a vertical height of the inclined area SA is represented as h (hereinafter, referred to as "h"). According to embodiments of the present disclosure, it is possible to provide a display panel with increased luminous efficiency by adjusting the $\theta$ and the d, or the $\theta$, the d and the h.

The angle $\theta$ between the first area A1 and the first inclined surface S1 may be larger than or equal to 27° or 45°. There is no restriction to the upper limit of the $\theta$ range. In this case, when the $\theta$ has a larger value, the possibility that cracks and breaks occur in the anode electrode ANO formed on the overcoat layer is increased. Accordingly, the upper limit may be preferably less than or equal to 80° or 85°.

By keeping $\theta$ within this range, it is possible for the second inclined surface S2 to effectively reflect the light emitted from the organic light emitting layer. Thus, it is possible to provide a display panel with increased luminous efficiency.

The horizontal distance d between the second inclined surface S2 and the third inclined surface S3 may be defined as a distance from the second inclined surface S2 to the third inclined surface S3, measured in parallel direction to the first area A1 of the overcoat layer. Distance d may be may be less than or equal to 3.2 µm, 2.6 µm or 2.0 µm. The smaller the d is, the greater the opening area OPN of the display panel expands. In this case, traveling paths of light reflected from the second inclined surface S2 may be reduced, and thus, luminous efficiency may be increased. To this end, there is no restriction to the lower limit of the d. The lower limit of the d may be preferably larger than or equal to 0.1 µm, 0.3 µm, or 0.5 µm. By adjusting the d range within this range, it is possible to expand an opening area and provide a display panel with increased luminous efficiency.

The vertical height h of the inclined area SA may denote a difference between the thickness T1' of the first area A1 portion and the thickness T2' of the second area A2 portion, which are connected by the inclined area SA. The vertical height h may be preferably larger than or equal to 0.7 µm, 1.2 µm, 1.4 µm, or 2 µm. The larger the h is, the greater the luminous efficiency increases because light emitted from the organic light emitting layer EL by the second inclined surface S2 is reflected effectively. To this end, there is no restriction to the upper limit of the h. The upper limit may be preferably less than or equal to 10 μm, or 5 μm.

As described above, by adjusting d, θ and h, the display panel according to the present disclosure provides increased luminous efficiency and may include the first light emitting area and the second light emitting area when organic light emitting layer emits light.

Figure 7A:
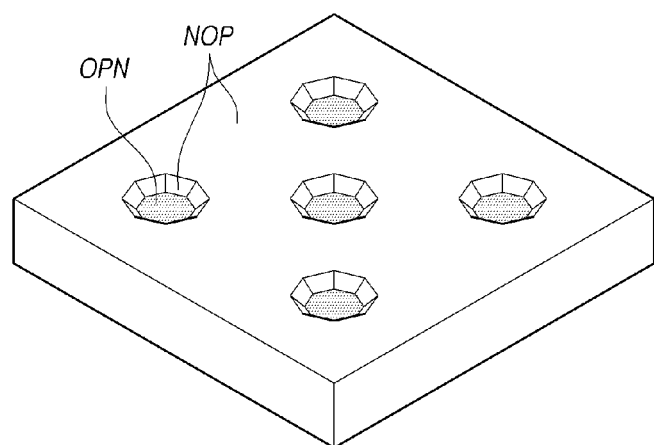
FIG. 7A is a view illustrating the display panel including an opening area and a non-opening area, according to embodiments of the present disclosure.
Figure 7B:
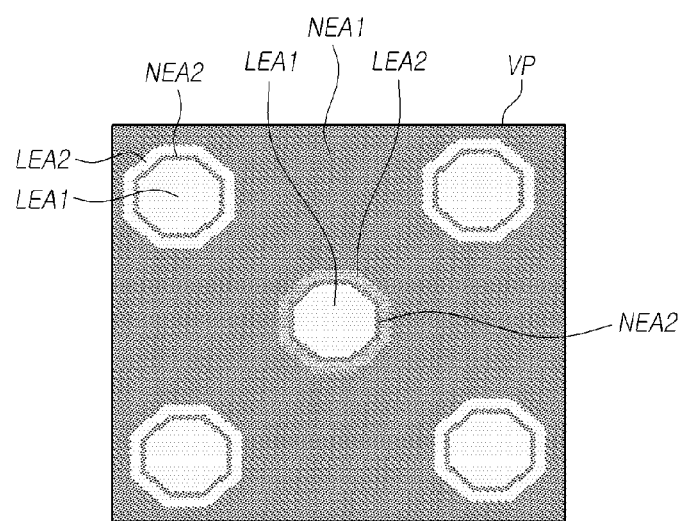
FIG. 7B is a view illustrating an image of the display panel including a first light emitting area, and a second light emitting area capture from a viewing plane, according to embodiments of the present disclosure.

FIGS. 7A and 7B are views showing an opening area, a non-opening area, a first light emitting area, and a second light emitting area included in the display panel, according to embodiments of the present disclosure. FIG. 7A shows a photomicrograp of the display panel inclining the opening area OPN and the non-opening area NOP having a specific shape. FIG. 7B is a view illustrating an image of the display panel including a first light emitting area, and a second light emitting area captured from the viewing plane VP.

The display panel according to the present disclosure may include a first light emitting area LEA1 (also referred to as a "main light emitting area") and a second non-light emitting area NEA2, in which visible light is emitted when the organic light emitting layer emits light, and a first non-light emitting area NEA1 and a second non-light emitting area NEA2.

The first light emitting area LEA1 may have a shape corresponding to the shape of the opening area OPN. The correspondence of a shape of an element to a shape of another element may mean that i) a shape of an element is an identical shape to another element, ii) two elements have an identical shape, but have different sizes from each other, or iii) a shape of an element may be formed by transferring the shape of another element. Accordingly, the shape of the first light emitting area LEA1 may mean that the shape of the opening area OPN is substantially transferred by light emitted from the organic light emitting layer EL located in the opening area OPN.

There is no restriction to the shape of the opening area OPN. The shape of the opening area OPN may preferably be, but not limited to, a polygonal shape such as a circle or a square, a pentagon, and an octagon. Referring to FIG. 7A, the opening area OPN has an octagonal shape.

The first light emitting area LEA1 may have a shape corresponding to the opening area OPN. Referring to FIG. 7B, the first light emitting area LEA1 has a shape corresponding to the shape of opening area OPN as shown in FIG. 7A.

The second light emitting area LEA2 ((also referred to as a "supplemental light emitting area") may not overlap with or separated from the first light emitting area LEA1 and may surround the first light emitting area LEA1. The second light emitting area LEA2 may have a shape corresponding to an edge shape of the first light emitting area LEA1. As shown in FIG. 7B, the second light emitting area LEA2 has a shape identical to the edge of the first light emitting area LEA1, but has different size from the first light emitting area LEA1. Therefore, it is possible to express that the second light emitting area LEA2 has a shape corresponding to the edge shape of the first light emitting area LEA1. The second light emitting area LEA2 may be a closed curve having an identical shape to the edge of the first light emitting area LEA1. As another example, the second light emitting area LEA2 may have a shape in which a portion of the closed curve is disconnected.

A plurality of subpixels may be distinguished by the first non-light emitting area NEA1. Referring to FIG. 7B, each of a plurality of second light emitting area LEA2 may be spaced apart from another by the first non-light emitting area NEA1. That is, the first non-light emitting area NEA1 may be an area between the second light emitting areas LEA2 in the non-opening area NOP.

That is, the first non-light emitting area NEA1 may be substantially an area from which light is not emitted. That is, the first non-light emitting area NEA1 may correspond to a portion in which the second light emitting area LEA2 is not formed in the non-opening area NOP.

The second non-light emitting area NEA2 may distinguish the first light emitting area LEA1 and the second light emitting area LEA2 formed by the subpixel and may be an area from which light is not substantially emitted.

The shape of the second non-light emitting area NEA2 may be determined depending on the shapes of the first light emitting area LEA1 and the second light emitting area LEA2. For example, in case the first light emitting area LEA1 has an octagonal shape, and the second light emitting area LEA2 has a closed curve with the octagonal shape, the second non-light emitting area NOP2 may have the octagonal shape by the first light emitting area LEA1 and the second light emitting area LEA2.

Although the second non-light emitting area NEA2 is described using the term of non-light emitting, it is possible for some light to be detected in the photograph because the second non-light emitting area NEA2 is located between the light emitting areas LEA1 and LEA2. In particular, it is possible for light with colors similar to a wavelength band of visible light emitted in the subpixel to be detected. Accordingly, the second non-light emitting area NEA2 may be an area from which light is not emitted at all. Alternatively, it should be understood that the second non-light emitting area NEA2 may be an area from which light weaker than what is emitted from the two light emitting areas is observed.

As described above, the second light emitting area LEA2 may be implemented by adjusting a range of θ, d, or h. Accordingly, the display panel according to embodiments of the present disclosure may have increased luminous efficiency and include the first light emitting area LEA1 and the second light emitting area LEA2, by adjusting a range of the θ, the d, or the h.

It is estimated that the second light emitting area LEA2 is formed by light traveling through paths described with reference to FIG. 5. The display panel according to embodiments of the present disclosure includes, as well as the first light emitting area LEA1, but the second light emitting area LEA2 formed by light reflected from the second inclined surface S2. Therefore, the display panel may have increased luminous efficiency.

The second light emitting area may be located in such a way that the second light emitting area surrounds the first light emitting area. This is estimated from, as a main reason, that the second light emitting area LEA2 is formed by light reflected from the second inclined surface S2 of the anode electrode ANO formed in the first inclined surface S1 located in the inclined area SA surrounding the first area A1.

In addition, the second light emitting area LEA2 may be located in the non-opening area NOP. As another embodiment, the overcoat layer may not include the inclined area, other than the display panel according to embodiments described above. In this case, among light emitted from the organic light emitting layer, only some of light traveling toward the opening area exits the display panel, and light traveling toward the non-opening area in which the bank layer is formed may be trapped within the display panel. Thus, in such display panels, light emitting area is observed in only the opening area.

However, as shown in FIG. 5, in the display panel according to embodiments of the present disclosure, among light emitted from the organic light emitting layer EL, light traveling toward the non-opening area is reflected from the second inclined surface S2 and goes out of the display panel, and therefore second light emitting area (LEA2) may be formed in the non-opening area NOP in which the bank layer is disposed, by the reflected light.

As shown in FIG. 5, the light from the first light emitting area LEA1 and the light from the second light emitting area LEA2 travel different paths and goes through different layers, and therefore may have different color coordinates. Accordingly, a color coordinate of visible light emitted from the first light emitting area may be different from a color coordinate of visible light emitted from the second light emitting area adjacent to the first light emitting area. As shown in FIG. 7B, a plurality of the first light emitting areas and the second light emitting areas may be formed according to the number of subpixels included in the display panel. Thus, it should be understood that the second light emitting area adjacent to the first light emitting area is a light emitting area included in an identical subpixel area, and denotes the second light emitting area adjacent to the first light emitting area of a plurality of the second light emitting area.

Figure 8:
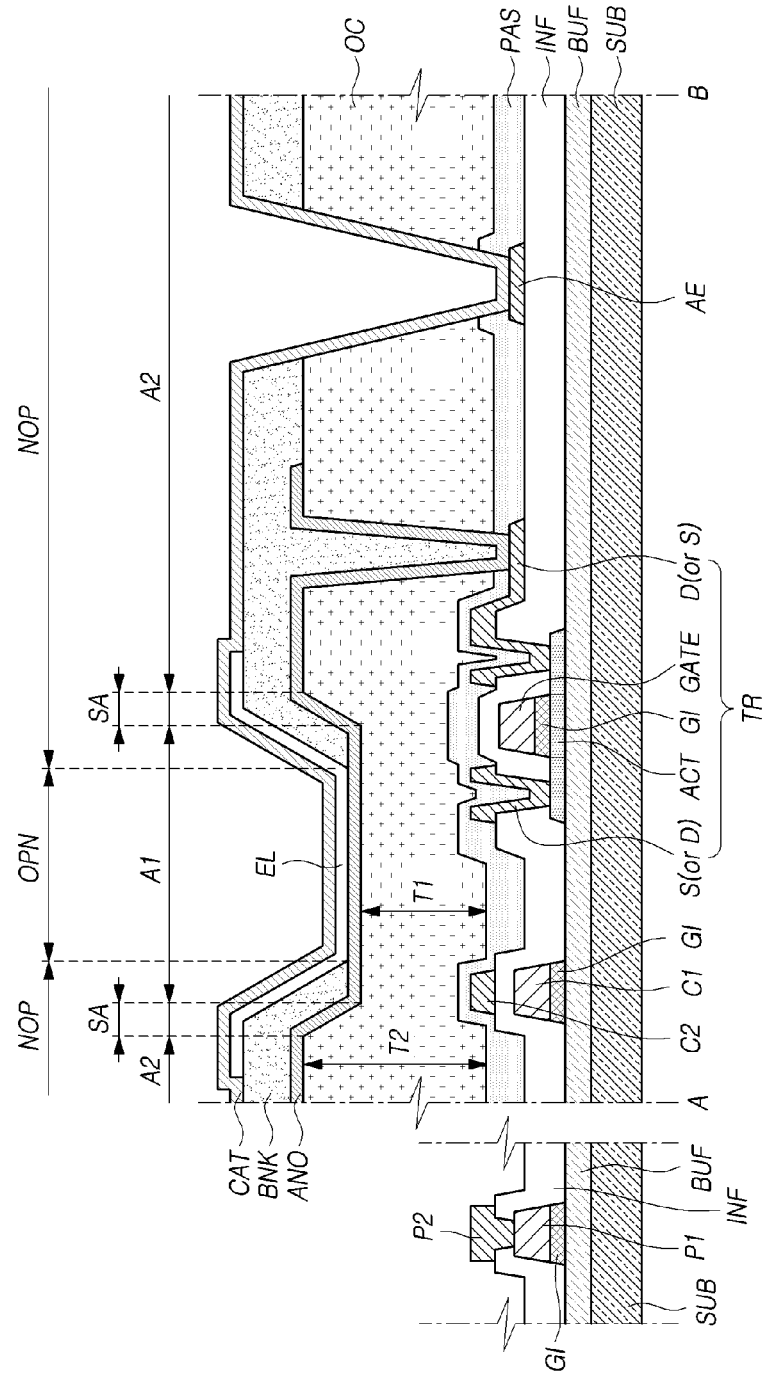
FIG. 8 is a cross-sectional view illustrating the display device according to embodiments of the present disclosure.

FIG. 8 is a cross-sectional view illustrating the display device according to embodiments of the present disclosure. Referring to FIG. 8, the organic light emitting layer EL may be located on a portion of the anode electrode ANO that is not covered by the bank layer BNK and the bank layer BNK, and the cathode electrode CAT may be located on the organic light emitting layer EL.

Table 1 below shows data on the luminous efficiency measured in Comparative examples and Embodiments.

Display panels used for the Embodiments have a structure as shown in FIG. 8. Each display panel in the Embodiments have identical configurations to others, except for being configured with the θ, the d and the h described in the Table 1. A display panel in the Comparative example has identical configurations to display panels in the Embodiments except for not including the first inclined surface to third inclined surface.

TABLE 1

|  | θ(°) | h(μm) | d(μm) | luminous efficiency(Cd/A) |
|---|---|---|---|---|
| Comparative example 1 | — | — | — | 55.5 |
| Embodiment 1 | 42 | 2 | 2.3 | 62.2 |
| Embodiment 2 | 34 | 2 | 3.2 | 58.0 |
| Embodiment 3 | 40 | 2 | 4.4 | 59.4 |
| Embodiment 4 | 44 | 2 | 5.2 | 59.0 |

In the Table 1, in case of Comparative example 1, there are no values of the θ, the h and the d because the first inclined surface to the third inclined surface are not included. It can be seen that luminous efficiency in the Embodiments 1 to 4 increases more than that in Comparative examples, and in particular, luminous efficiency in the Embodiments 1 and 2 with the d less than or equal to 3.2 μm increase more than that in the Embodiments 3 and 4. In particular, it can be observed that the Embodiment 1 in which the d less than or equal to 2.3 μm shows the most increased luminous efficiency.

In case the organic light emitting layer EL is disposed in, as well as the opening area OPN in which the bank layer BNK is not disposed, but the non-opening area NOP in which the bank layer BNK is disposed, it is possible to maximize the area of the organic light emitting layer EL in which light emitting is performed. In case the organic light emitting layer EL is disposed in only the opening area OPN, due to limitations in process, the organic light emitting layer EL may not be formed in an edge portion of the opening area OPN or may be incompletely formed. However as described above, in case the organic light emitting layer EL is disposed on the bank layer BNK, it is possible to overcome some problems with limitations in process.

Table 2 below shows data related to whether the second light emitting area is included according to the θ, the d and the h.

TABLE 2

|  | θ(°) | h(μm) | d(μm) | Whether the second light emitting area is disposed |
|---|---|---|---|---|
| Comparative example 2 | 8.0 | 0.60 | 2.0 | X |
| Comparative example 3 | 25.0 | 1.70 | 2.0 | X |
| Comparative example 4 | 25.8 | 1.70 | 2.0 | X |
| Embodiment 5 | 45.0 | 1.40 | 2.0 | ○ |
| Embodiment 6 | 60.0 | 2.00 | 2.0 | ○ |
| Embodiment 7 | 60.0 | 2.04 | 2.0 | ○ |

The Comparative examples 2 and 3 and the Embodiments 4 to 7 are based on the display panel as shown in FIG. 4 and have identical configurations except for different θs and hs as described in Table 2.

Referring to Table 2, it can be seen that, in case the display panel is configured with a larger θ and a larger h, the second light emitting area is formed because the second inclined surface of the reflective electrode can effectively reflect light emitted from the organic light emitting layer.

In case the organic light emitting layer EL is formed as shown in FIG. 8, a first light emitting layer emitting a first color and a second light emitting layer emitting a second color may be disposed on the anode electrode ANO and the bank layer BNK. In this case, each of the first light emitting layer emitting the first color and the second light emitting layer emitting the second color is disposed in a different opening area OPN distinguished by the bank layer BNK, it is possible to omit to use a large mask and to simplify a related process.

Figure 9:
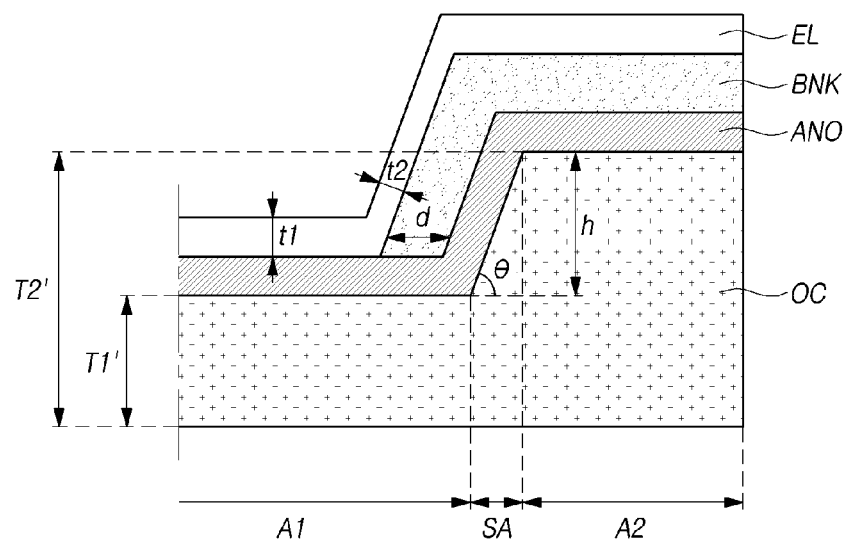
FIG. 9 is a cross-sectional view illustrating a part of the display device according to embodiments of the present disclosure.

FIG. 9 is a cross-sectional view illustrating a part of the display device according to embodiments of the present disclosure. Referring to FIG. 9, the thickness t1 of the organic light emitting layer EL disposed on the anode electrode ANO is larger than the thickness t2 of the organic light emitting layer EL disposed on the third inclined surface S3 of the bank layer BNK.

The difference in the thicknesses of the organic light emitting layer may be caused by the third inclined surface S3 of the bank layer BNK. The organic light emitting layer EL may be formed by a thermal evaporation process, which is a physical vapor deposition technique. In case the thermal evaporation process is used on the inclined surface, such as third inclined surface S3, the thickness of the deposited layer may be reduced due to characteristics of the thermal deposition process.

In case a portion of the organic light emitting layer is thinned, the density of carriers may be increased at an electrode adjacent to an organic light emitting layer with a thin thickness and result in the organic light emitting layer being deteriorated. However, it is possible to prevent such problems in the display panel according to embodiments of the present disclosure, as shown in FIG. 9, because the bank layer BNK is located between the reflective electrode EL and the organic light emitting layer EL, in a portion in which the organic light emitting layer EL has the thinned thickness t2.

Although a preferred embodiment of the present disclosure has been described for illustrative purposes, those skilled in the art will appreciate that various modifications, additions and substitutions are possible, without departing from the scope and spirit of the invention as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel comprising:
   an overcoat layer on a substrate, the overcoat layer including a first inclined surface;
   a first electrode on the overcoat layer, the first electrode being reflective of light and having a second inclined surface overlapping with the first inclined surface;
   a bank layer covering a portion of the first electrode but exposing at least another portion of the first electrode, the bank layer including a third inclined surface overlapping with both the first inclined surface and the second inclined surface;
   an organic light emitting layer on the first electrode and on the third inclined surface of the bank layer, wherein a first thickness of the organic light emitting layer on the another portion of the first electrode is greater than a second thickness of the organic light emitting layer on the third inclined surface of the bank layer; and
   a second electrode on the organic light emitting layer and the bank layer,
   wherein the first electrode, the organic light emitting layer, and the second electrode emits a first portion of light responsive to an applied voltage and forms a main light emitting area on a viewing plane;
   wherein at least one of the first inclined surface, the second inclined surface, and the third inclined surface reflects the first portion of light and forms a supplemental light emitting area surrounding the main area in the viewing plane, and
   wherein a distance between the second inclined surface and the third inclined surface is in a range of 2.3 µm to 5.2 µm,
   wherein a height of the first inclined surface of the overcoat layer is 2 µm, and
   wherein an angle θ of the first inclined surface of the overcoat layer is within 45° to 85°.

2. The display panel of claim 1, wherein the portion of the first electrode contacts a transistor via a contact hole under the bank layer.

3. The display panel of claim 1, wherein the supplemental light emitting area is formed for sub-pixels of only one or two colors.

4. The display panel of claim 1, wherein the supplemental light emitting area is discontinuous.

5. The display panel of claim 1, wherein the supplemental light emitting area has a shape of a closed curve.

6. The display panel of claim 1, wherein at least one of brightness, shape and color coordinate of the supplemental light emitting area for the sub-pixel is different from the at least one of brightness, shape and color coordinate of the corresponding main area for the same sub-pixel.

7. The display panel of claim 1, further comprising auxiliary electrodes connected to a subset of sub-pixels, wherein the auxiliary electrodes are outside an area where the organic light emitting layer is present.

8. The display panel of claim 1, further comprising a storage capacitor at least a part of which overlaps the inclined surface.

9. A display panel comprising:
   a substrate;
   an overcoat layer disposed over the substrate and including a first area, a second area and an inclined area, the second area being thicker than the first area and surrounding the first area, the inclined area located between the first area and the second area and including a first inclined surface connecting the first area and the second area;
   a reflective electrode disposed on the overcoat layer, formed along with a surface of the overcoat layer, and including a second inclined surface located over the first inclined surface;
   a bank layer disposed on the reflective electrode, located on the second area, the inclined area, and a portion of the first area connected to the inclined area, and including a third inclined surface disposed along with the second inclined surface;
   an organic light emitting layer disposed on the reflective electrode, wherein a first thickness of the organic light emitting layer contacting the reflective electrode in the first area is greater than a second thickness of the organic light emitting layer on the third inclined surface of the bank layer;
   a cathode electrode disposed on the organic light emitting layer; and
   wherein the display panel includes two areas that are an opening area corresponding to an area that is not covered by the bank layer and a non-opening area corresponding to an area that is covered by the bank layer, the display panel further comprising:
   a first light emitting area in which visible light is emitted when the organic light emitting layer performs light emitting;
   a second light emitting area in which visible light is emitted when the organic light emitting layer performs light emitting, that does not overlap with the first light emitting area, and surrounds the first light emitting area in the non-opening area;
   a first non-light emitting area located between at least two second light emitting areas; and
   a second non-light emitting area located between the first light emitting area and the second light emitting area,
   wherein a distance between the second inclined surface and the third inclined surface is in a range of 2.3 µm to 5.2 µm,
   wherein a height of the first inclined surface of the overcoat layer is 2 µm, and wherein an angle θ of the first inclined surface of the overcoat layer is within 45° to 85°.

10. The display panel according to claim 9, wherein an angle between the first inclined surface and the first area is larger than or equal to 27° and less than or equal to 85°.

11. The display panel according to claim 9, wherein the first light emitting area has a shape corresponding to a shape of the opening area, and the second light emitting area has a shape corresponding to a shape of an edge of the first light emitting area.

12. The display panel according to claim 9, wherein the second non-light emitting area is located in the non-opening area.

13. The display panel according to claim 9, wherein color coordinates of visible light emitted from the first light emitting area are different from color coordinates of visible light emitted from the second light emitting area adjacent to the first light emitting area.

14. The display panel according to claim 9, wherein the first non-light emitting area corresponds to a portion in the non-opening area where the second light emitting area does not exist.

15. The display panel according to claim 9, wherein the organic light emitting layer is disposed on the reflective electrode that is not covered by the bank layer.

\* \* \* \* \*